(12) United States Patent
Ma et al.

(10) Patent No.: US 11,094,772 B2
(45) Date of Patent: Aug. 17, 2021

(54) DISPLAY PANEL AND DISPLAY DEVICE WITH COMPENSATION SUB-PIXELS

(71) Applicant: WuHan TianMa Micro-electronics CO., LTD, Wuhan (CN)

(72) Inventors: Yangzhao Ma, Wuhan (CN); Ruiyuan Zhou, Wuhan (CN); Yingjie Chen, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 19 days.

(21) Appl. No.: 16/729,231

(22) Filed: Dec. 27, 2019

(65) Prior Publication Data

US 2021/0066427 A1 Mar. 4, 2021

(30) Foreign Application Priority Data

Aug. 29, 2019 (CN) .......................... 201910808701.0

(51) Int. Cl.
*H01L 27/32* (2006.01)
*H01L 27/15* (2006.01)
*H04N 5/225* (2006.01)

(52) U.S. Cl.
CPC ........ *H01L 27/3276* (2013.01); *H01L 27/156* (2013.01); *H01L 27/3223* (2013.01); *H01L 27/3246* (2013.01); *H04N 5/2257* (2013.01)

(58) Field of Classification Search
CPC .............. H01L 27/3276; H01L 27/156; H01L 27/3223; H01L 27/3246; H04N 5/2257
See application file for complete search history.

(56) References Cited

U.S. PATENT DOCUMENTS

| 8,520,114 B2 * | 8/2013 | Cok | ..................... H01L 27/3227 348/333.01 |
| 2018/0129328 A1 * | 5/2018 | Park | ...................... G06F 1/3231 |
| 2020/0194730 A1 * | 6/2020 | Park | ..................... H01L 27/3262 |
| 2021/0064087 A1 * | 3/2021 | Ma | ......................... G06F 1/1637 |

FOREIGN PATENT DOCUMENTS

CN 107819018 A 3/2018

* cited by examiner

*Primary Examiner* — Lex H Malsawma
(74) *Attorney, Agent, or Firm* — Christensen O'Connor Johnson Kindness PLLC

(57) ABSTRACT

The present disclosure provides a display panel having sub-pixels that include light-emitting sub-pixels and compensation sub-pixels located in a first display area. A density of sub-pixels in a first semi-transmissive area and in a second semi-transmissive area is smaller than a density of sub-pixels in a second display area. The first display area, the first semi-transmissive area, and the second semi-transmissive area have a same density of light-emitting sub-pixels. First pixel columns are provided in the first display area. Second pixel columns are provided in the second display area. A first data line passes through the first pixel column, and a second data line passes through the second pixel column.

19 Claims, 11 Drawing Sheets

DISPLAY PANEL AND DISPLAY DEVICE WITH COMPENSATION SUB-PIXELS

CROSS-REFERENCE TO RELATED APPLICATIONS

The present disclosure claims priority to Chinese Patent Application No. 201910808701.0, filed on Aug. 29, 2019, the content of which is incorporated herein by reference in its entirety.

TECHNICAL FIELD

The present disclosure relates to the technical field of display technologies, and in particular, to a display panel and a display device.

BACKGROUND

At present, in order to achieve a better full-screen design and further increase a screen ratio, a display area of a display panel generally includes a semi-transmissive area, in which sub-pixels and a camera assembly for achieving a camera shooting function are provided. When the display panel is in a display mode, the sub-pixels in the semi-transmissive area emit light and the camera assembly does not work. When the display panel is in a camera shooting mode, the sub-pixels in the semi-transmissive area do not emit light and the camera assembly performs camera shooting. In the related art, in order to improve transmittance of the semi-transmissive area and achieve high-quality imaging, a density of the sub-pixels in the semi-transmissive area is generally set to be smaller than a density of sub-pixels in a conventional display area. However, as a result, a resolution of the semi-transmissive area is different from that of the conventional display area, thereby affecting display performance.

SUMMARY

In view of this, the present disclosure provides a display panel and a display device, which effectively reduce a load difference on data lines while improving an image quality.

In an aspect, the present disclosure provides a display panel, having a display area including a first semi-transmissive area, a second semi-transmissive area, a first display area, and a second display area. The first semi-transmissive area, the first display area, and the second semi-transmissive area are sequentially arranged in a first direction, and the second display area is located at a side of at least one of the first semi-transmissive area or the second semi-transmissive area facing away from the first display area. The display panel includes: a substrate; a pixel circuit layer and a light-emitting element layer located on the substrate; a plurality of sub-pixels including light-emitting sub-pixels and compensation sub-pixels, the light-emitting sub-pixels being configured to emit light and configured to display images, and the compensation sub-pixels being not capable of emitting light and not configured to display images; and data lines each extending in a second direction, the data lines including first data lines and second data lines. The compensation sub-pixels are only located in the first display area; a density of sub-pixels in the first semi-transmissive area and a density of sub-pixels in the second semi-transmissive area are smaller than a density of sub-pixels in the second display area; and the first display area, the first semi-transmissive area, and the second semi-transmissive area have a same density of light-emitting sub-pixels. A plurality of first pixel columns is provided in the first display area, and a plurality of second pixel columns is provided in the second display area; each of the first data lines passes through a respective first pixel column of the plurality of first pixel columns, and each of the second data lines passes through a respective second pixel column of the plurality of second pixel columns; each of the plurality of first pixel columns includes n1 sub-pixels arranged in the second direction, and each of the plurality of second pixel columns includes n2 sub-pixels arranged in the second direction, where n1=K*n2 and 0.99≤K≤1.01; and the second direction intersects the first direction.

In another aspect, the present disclosure provides a display device including the display panel described above.

BRIEF DESCRIPTION OF DRAWINGS

In order to more clearly illustrate technical solutions in representative and non-limiting embodiments of the present disclosure, the accompanying drawings used in the embodiments are briefly introduced as follows.

DESCRIPTION OF EMBODIMENTS

For better illustrating technical solutions of the present disclosure, embodiments of the present disclosure will be described in detail as follows with reference to the accompanying drawings.

It should be noted that, the described embodiments are representative and non-limiting embodiments of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

Figure 1:
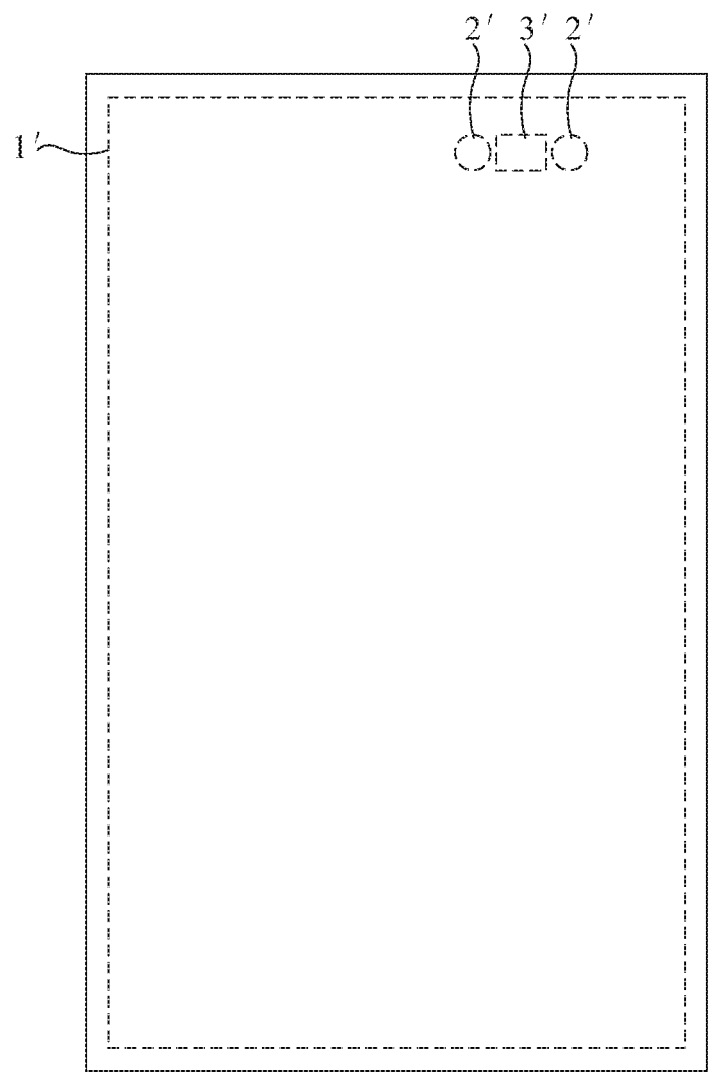
FIG. 1 is a schematic diagram illustrating a structure of a display panel in the related art.

In the related art, taking FIG. 1 as an example, which is a schematic diagram illustrating a structure of a display panel in the related art, the display area 1' of the display panel includes two semi-transmissive areas 2', and the semi-transmissive area 2' is provided with sub-pixels and a camera assembly. In order to improve transmittance of the semi-transmissive area 2' and achieve high-quality imaging, a density of the sub-pixels in the semi-transmissive area 2' is smaller than a density of sub-pixels in a conventional display area, resulting in that the semi-transmissive area 2' and the conventional display area have different resolutions. In this case, when the display panel displays an image, the image is displayed at different precisions in the semi-transmissive area 2' and in the conventional display area. In particular, for a first display area 3', since the first display area 3' is located between the two semi-transmissive areas 2', a difference in precision of the image displayed in the first display area 3' and in the two semi-transmissive area 2' will be more easily perceived by human eyes. As a result, the image in the first display area 3' is grainy, which affects a display quality.

Figure 2:
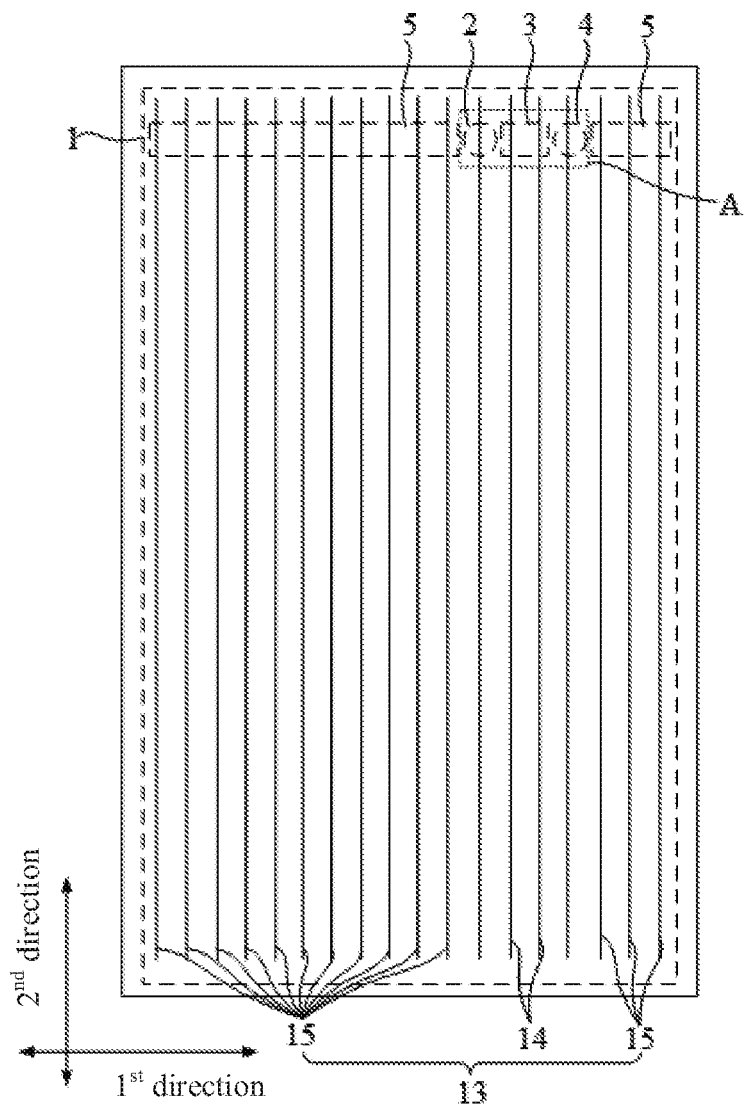
FIG. 2 is a schematic diagram illustrating a structure of a display panel according to a representative embodiment of the present disclosure.
Figure 3:
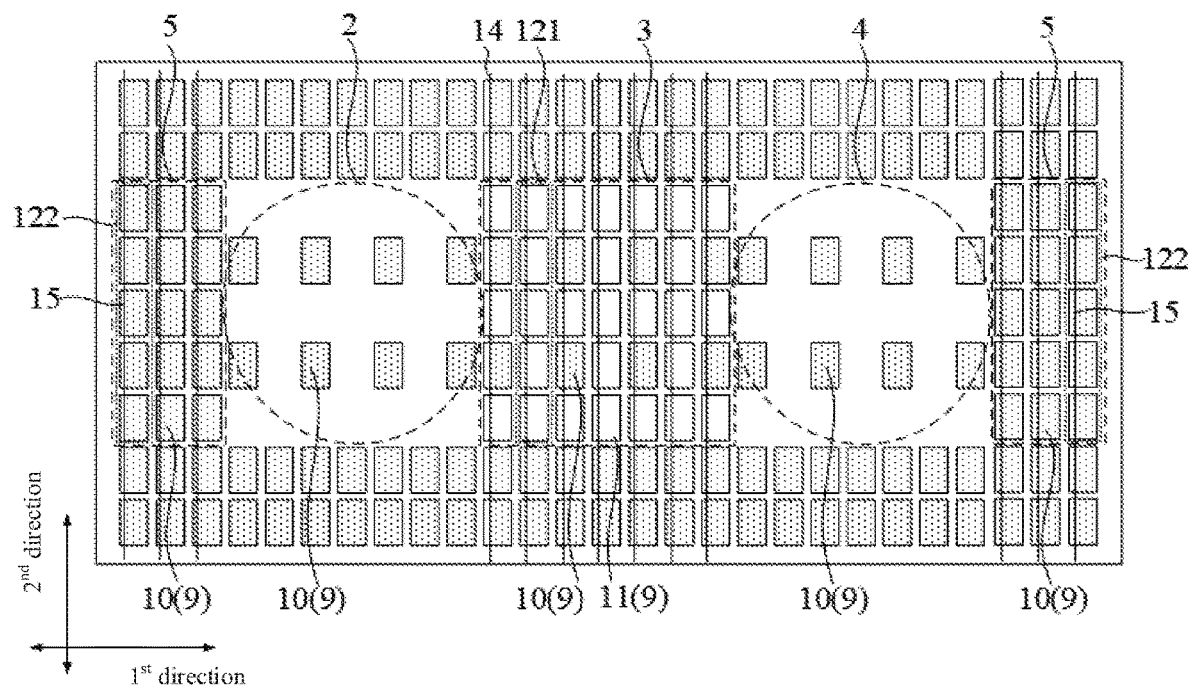
FIG. 3 is an enlarged view of an area A of FIG. 2.
Figure 4:
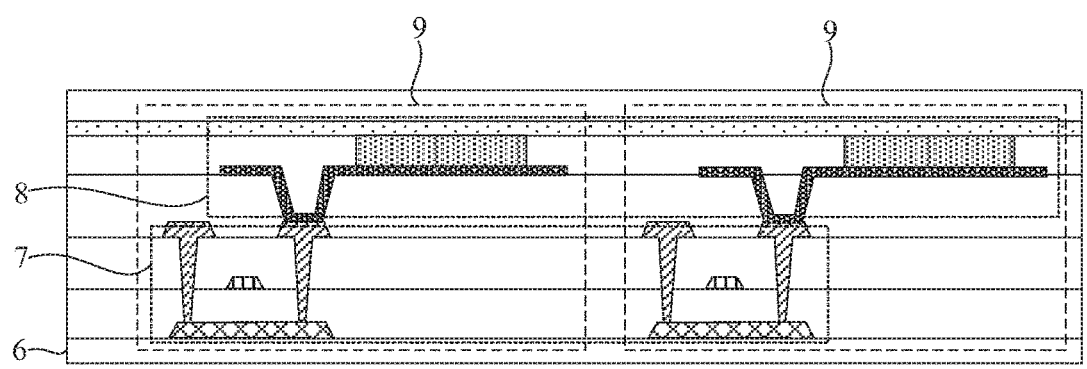
FIG. 4 is a schematic diagram illustrating a film layer structure of sub-pixels according to a representative embodiment of the present disclosure.

Based on this, an embodiment of the present disclosure provides a display panel. FIG. 2 is a schematic diagram illustrating a structure of a display panel according to an embodiment of the present disclosure, FIG. 3 is an enlarged view of an area A of FIG. 2, and FIG. 4 is a schematic diagram illustrating a film layer structure of sub-pixels according to an embodiment of the present disclosure. As shown in FIG. 2 to FIG. 4, the display panel has a display area 1 including a first semi-transmissive area 2, a second semi-transmissive area 4, a first display area 3, and a second display area 5. The first semi-transmissive area 2, the first display area 3, and the second semi-transmissive area 4 are sequentially arranged in a first direction. The second display area 5 is located at a side of the first semi-transmissive area 2 and/or a side of the second semi-transmissive area 4 facing away from the first display area 3.

The display panel includes a base substrate 6, a pixel circuit layer 7 and a light-emitting element layer 8 that are disposed on the base substrate 6, and a plurality of sub-pixels 9 including light-emitting sub-pixels 10 and compensation sub-pixels 11. The light-emitting sub-pixels 10 are sub-pixels 9 configured to emit light and used for image display, and the compensation sub-pixels 11 are sub-pixels 9 not capable of emitting light and not used for image display. The compensation sub-pixels 11 are located in the first display area 3 (e.g., only located in the first display area). A density of the sub-pixels 9 in the first semi-transmissive area 2 and in the second semi-transmissive area 4 is smaller than a density of the sub-pixels 9 in the second display area 5. The light-emitting sub-pixels 10 have a same density in the first display area 3, in the first semi-transmissive area 2, and in the second semi-transmissive area 4.

In addition, the display panel further includes data lines 13 each extending in a second direction. The data lines 13 include first data lines 14 and second data lines 15. The first display area 3 is provided with a plurality of first pixel columns 121, and the second display area 5 is provided with a plurality of second pixel columns 122. The first data line 14 extends through the first pixel column 121, and the second data line 15 extends through the second pixel column 122. The first pixel column 121 includes n1 sub-pixels 9 arranged in the second direction, and the second pixel column 122 includes n2 sub-pixels 9 arranged in the second direction, where $n1=K*n2$, $0.99 \leq K \leq 1.01$, and the second direction intersects the first direction.

First, it should be noted that the density of sub-pixels 9 refers to a number of sub-pixels 9 per unit area, and the data line 13 passing through the pixel column means that the data line 13 overlaps a film layer where the pixel column is located. Moreover, in order to drive the light-emitting sub-pixel 10 to emit light and achieve normal image display of the display panel, the data line 13 is electrically connected to the light-emitting sub-pixel 10. However, for the compensation sub-pixel 11 not used for image display, the data line 13 may or may not be electrically connected to the compensation sub-pixel 11. When the data line 13 is electrically connected to the compensation sub-pixel 11, the compensation sub-pixel 11 does not emit light by adjusting a structure of the compensation sub-pixel 11, and a configuration manner thereof is shown in embodiments in the following.

In addition, it should be noted that the first semi-transmissive area 2 and the second semi-transmissive area 4 are also provided with a camera assembly for achieving a camera shooting function. When the display panel is in a display mode, the light-emitting sub-pixels 10 in the first semi-transmissive area 2 and in the second semi-transmissive area 4 emit light and the camera assembly does not work. When the display panel is in a camera shooting mode, the light-emitting sub-pixels 10 in the first semi-transmissive area 2 and in the second semi-transmissive area 4 do not emit light and the camera assembly performs camera shooting. Moreover, a shape of the first semi-transmissive area 2 and a shape of the second semi-transmissive area 4 may be designed according to actual needs, which will not be limited herein in the embodiment of the present disclosure.

According to the display panel provided by this embodiment of the present disclosure, for the first display area 3 between the first semi-transmissive area 2 and the second semi-transmissive area 4, a density of light-emitting sub-pixels 10 in the first display area 3 is the same as the density of light-emitting sub-pixels 10 in the first semi-transmissive area 2 and in the second semi-transmissive area 4. In this way, the first display area 3, the first semi-transmissive area 2, and the second semi-transmissive area 4 have a same resolution, so that an image can be displayed at a same precision in the first display area 3, in the first semi-transmissive area 2, and in the second semi-transmissive area 4, thereby effectively weakening graininess of the image displayed in the first display area 3 while improving the image quality.

Further, the inventors have found that in a case in which the density of light-emitting sub-pixels 10 in the first display area 3 is adjusted (e.g., when only the density of light-emitting sub-pixels 10 in the first display area 3 is adjusted), although the graininess can be weakened, for the data lines passing through the first display area 3 and the second display area 5, the two data lines need to drive different numbers of sub-pixels, which results in inconsistent loads on the two data lines, thereby affecting display uniformity. Therefore, in an embodiment of the present disclosure, by further providing compensation sub-pixels 11 in the first display area 3, a difference between the number of light-emitting sub-pixels 10 in the first pixel column 121 and the number of light-emitting sub-pixels 10 in the second pixel column 122 can be compensated by the compensation sub-pixels 11, so that the number of sub-pixels 9 in the first pixel column 121 and the number of sub-pixels 9 in the second pixel column 122 tend to be the same. In this way, when the first data line 14 passes through the first pixel column 121 and the second data line 15 passes through the second pixel column 122, the number of sub-pixels 9 passed through by the first data line 14 and the number of sub-pixels 9 passed through by the second data line 15 tend to be the same. As a result, coupling capacitance formed between the first data line 14 and a film layer in which the sub-pixels 9 in the first pixel column 121 are located and coupling capacitance formed between the second data line 15 and a film layer in which the sub-pixels 9 in the second pixel column 122 are located tend to be the same, thereby allowing the load on the first data line 14 and the load on the second data line 15 to be consistent, which effectively improves display uniformity.

Therefore, with the display panel provided by this embodiment of the present disclosure, the first display area 3, the first semi-transmissive area 2 and the second semi-transmissive area 4 can have a same resolution, and graininess is effectively weakened. This can further allow the load on the first data line 14 and the load on the second data line 15 to be uniform and thus improve the display uniformity, while improving the display quality.

In addition, it should be noted that although the density of light-emitting sub-pixels 10 in the first semi-transmissive area 2, in the second semi-transmissive area 4, and in the first display area 3 is smaller than the density of light-emitting sub-pixels 10 in other conventional display area such as the second display area 5, a larger driving current can be supplied to the light-emitting sub-pixels 10 in the first semi-transmissive area 2, in the second semi-transmissive area 4, and in the first display area 3 when driving the light-emitting sub-pixels 10 to emit light. In this way, display brightness in the first semi-transmissive area 2, in the second semi-transmissive area 4, and in the first display area 3 is the same as display brightness in other conventional display area, so that brightness uniformity can be improved.

Figure 5:
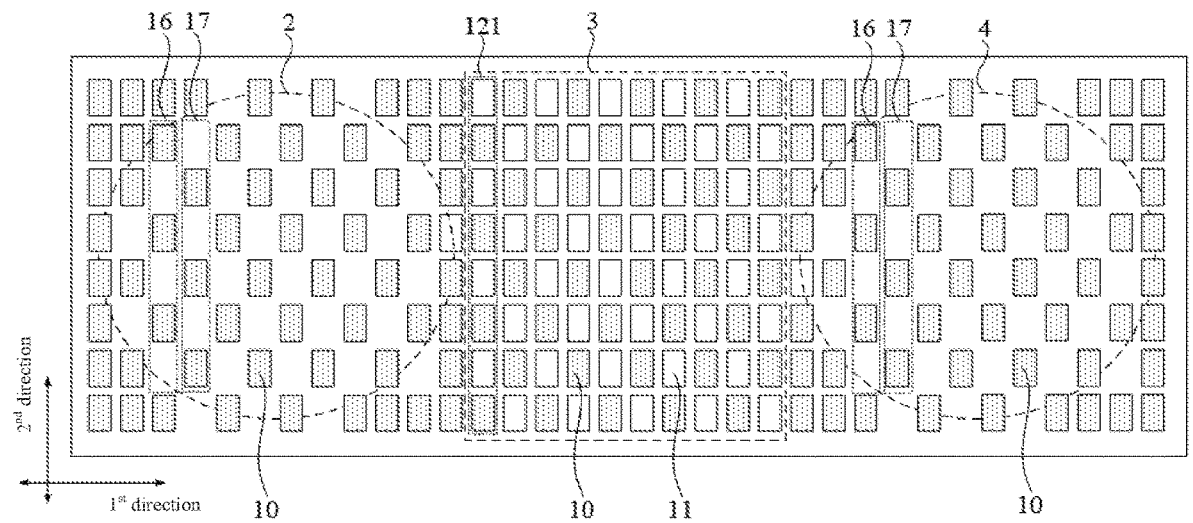
FIG. 5 is a schematic diagram illustrating an arrangement of sub-pixels in a first semi-transmissive area, a first display area, and a second semi-transmissive area according to a representative embodiment of the present disclosure.

FIG. 5 is a schematic diagram illustrating an arrangement of sub-pixels in a first semi-transmissive area, a first display area, and a second semi-transmissive area according to an embodiment of the present disclosure. In an embodiment, as shown in FIG. 5, each of the first semi-transmissive area 2 and the second semi-transmissive area 4 is provided with third pixel columns 16 and fourth pixel columns 17 that are alternately arranged in the first direction. The light-emitting sub-pixels 10 in the third pixel column 16 and in the fourth pixel column 17 are arranged in a misalignment manner in the first direction. An arrangement of light-emitting sub-pixels 10 in the first display area 3 is the same as (i.e., identical to) an arrangement of light-emitting sub-pixels 10 in the first semi-transmissive area 2 and in the second semi-transmissive area 4, and each sub-pixel column in the first display area 3 includes a same number of compensation sub-pixels 11.

It should be noted that the arrangement of light-emitting sub-pixels 10 in the first display area 3 being the same as (i.e., identical to) the arrangement of light-emitting sub-pixels 10 in the first semi-transmissive area 2 and in the second semi-transmissive area 4 means that an arrangement rule of light-emitting sub-pixels 10 in the first display area 3 is the same as an arrangement rule of light-emitting sub-pixels 10 in the first semi-transmissive area 2 and in the second semi-transmissive area 4. That is, if each of the first display area 3, the first semi-transmissive area 2 and the second semi-transmissive area 4 is divided into a plurality of minimum pixel repeating units, a position of the light-emitting sub-pixel 10 in the first display area 3 in the minimum pixel repeating unit is the same as a position of the light-emitting sub-pixel 10 in the first semi-transmissive area 2 and in the second semi-transmissive area 4 in the minimum pixel repeating unit. That is, in the configuration described above, the light-emitting sub-pixels 10 in two adjacent first pixel columns 121 in the first display area 3 are arranged in a misalignment manner in the first direction.

With the configuration described above, the light-emitting sub-pixels 10 in the third pixel column 16 and the fourth pixel column 17 are arranged in a misalignment manner in the first direction. In this way, the arrangement of light-emitting sub-pixels 10 in the first semi-transmissive area 2 and in the second semi-transmissive area 4 are relatively uniform and dispersed under a premise of allowing the first semi-transmissive area 2 and the second semi-transmissive area 4 to have certain transmittance. This prevents the light-emitting sub-pixels 10 from being concentrated in a certain area. When the display panel is in the display mode, brightness uniformity of each of the first semi-transmissive area 2 and the second semi-transmissive area 4 can be improved. Moreover, the arrangement of light-emitting sub-pixels 10 in the first display area 3 is the same as the arrangement of light-emitting sub-pixels 10 in the first semi-transmissive area 2 and in the second semi-transmissive area 4, and each sub-pixel column in the first display area 3 has a same number of compensation sub-pixels 11. Therefore, when the compensation sub-pixels 11 are used to compensate for the difference between the number of light-emitting sub-pixels 10 in the first pixel column 121 and the number of light-emitting sub-pixels 10 in the second pixel column 122 to reduce the load difference between the first data line 14 and the second data line 15, each first pixel column 121 in the first display area 3 can have a same number of sub-pixels 9, thereby further improving the load uniformity between a plurality of first data lines 14.

Figure 6:
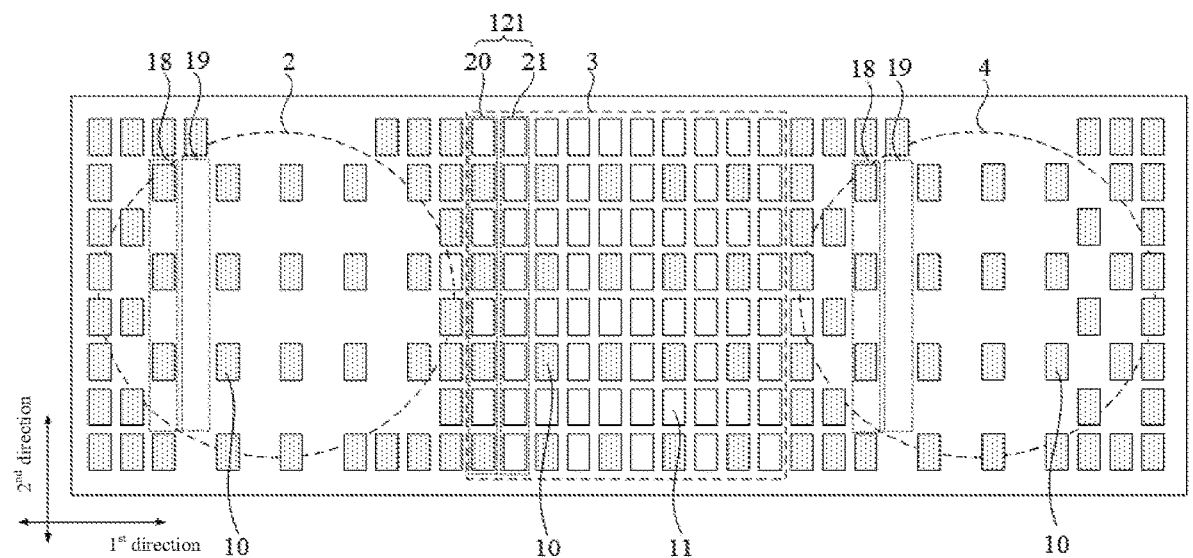
FIG. 6 is a schematic diagram illustrating another arrangement of sub-pixels in a first semi-transmissive area, a first display area, and a second semi-transmissive area according to a representative embodiment of the present disclosure.

FIG. 6 is a schematic diagram illustrating another arrangement of sub-pixels in a first semi-transmissive area, a first display area, and a second semi-transmissive area according to an embodiment of the present disclosure. In an embodiment, as shown in FIG. 6, each of the first semi-transmissive area 2 and the second semi-transmissive area 4 is provided with fifth pixel columns 18 and blank columns 19 that are alternately arranged in the first direction, and the blank column 19 includes no sub-pixel 9. An arrangement of light-emitting sub-pixels 10 in the first display area 3 is the same as an arrangement of light-emitting sub-pixels 10 in the first semi-transmissive area 2 and in the second semi-transmissive area 4. The first pixel column 121 includes first sub-pixel columns 20 and second sub-pixel columns 21 that are alternately arranged in the first direction. The first sub-pixel column 20 includes light-emitting sub-pixels 10 and compensation sub-pixels 11, and the second sub-pixel column 21 includes compensation sub-pixels 11 (e.g., only compensation sub-pixels 11).

With the configuration described above, the fifth pixel column 18 and the blank column 19 in the first semi-transmissive area 2 and in the second semi-transmissive area 4 are alternately arranged, so that the light-emitting sub-pixels 10 in the first semi-transmissive area 2 and in the second semi-transmissive area 4 are relatively uniform, thereby improving brightness uniformity of each of the first semi-transmissive area 2 and the second semi-transmissive area 4. Moreover, since the blank column 19 includes no sub-pixel, a transmissive area in the first semi-transmissive area 2 and in the second semi-transmissive area 4 can be aggregated, and transmittance of the first semi-transmissive area 2 and in the second semi-transmissive area 4 can be effectively improved, thereby optimizing the image quality.

Figure 7:
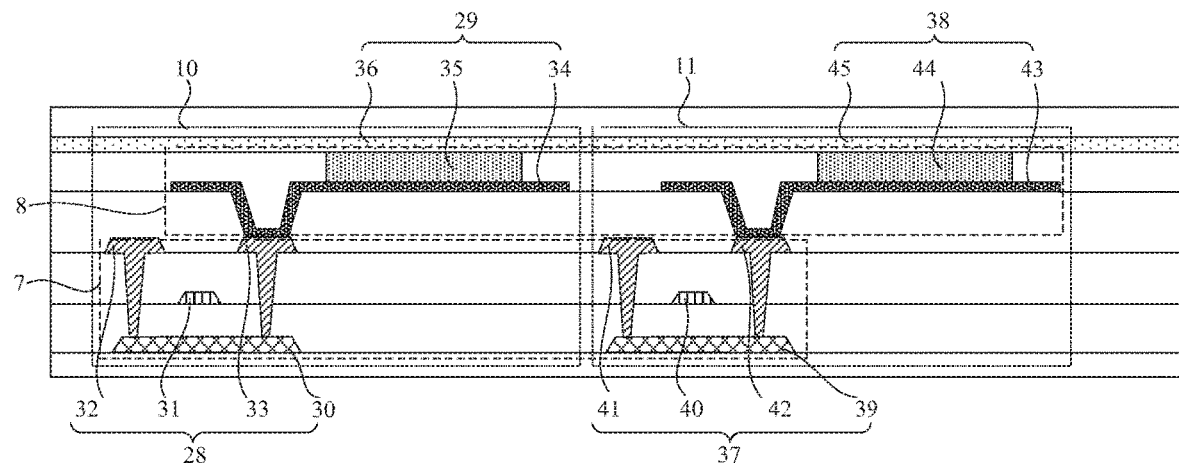
FIG. 7 is a schematic diagram illustrating a film layer structure of a compensation sub-pixel according to a representative embodiment of the present disclosure.

FIG. 7 is a schematic diagram illustrating a film layer structure of a compensation sub-pixel according to an embodiment of the present disclosure. In an embodiment, as shown in FIG. 7, the pixel circuit layer 7 includes an active layer, a gate layer, and a source-drain layer, and the light-emitting element layer 8 includes an anode layer, a light-emitting layer, and a cathode layer. In order to make the light-emitting sub-pixel 10 normally emit light, the light-emitting sub-pixel 10 includes a first pixel circuit 28 and a first light-emitting element 29. The first pixel circuit 28 includes a first active layer 30 located in the active layer, a first gate electrode 31 located in the gate layer, and a first source electrode 32 and a first drain electrode 33 that are located in the source-drain layer. The first light-emitting element 29 includes a first anode 34 located in the anode layer, a first light-emitting layer 35 located the light-emitting layer, and a first cathode 36 located in the cathode layer. When the data line 13 passes through the light-emitting sub-pixel 10, the data line 13 forms coupling capacitance respectively with the first active layer 30, the first gate electrode 31, the first source electrode 32, the first drain electrode 33, the first anode 34, and the first cathode 36.

In an embodiment, with further reference to FIG. 7, the display panel further includes a plurality of signal transmission lines (not shown), and the signal transmission lines are electrically connected to the first pixel circuits 28. The compensation sub-pixel 11 includes a second pixel circuit 37 and a second light-emitting element 38. The signal transmission line is electrically insulated from the second pixel circuit 37. The second pixel circuit 37 includes a second active layer 39 located in the active layer, a second gate electrode 40 located in the gate layer, and a second source electrode 41 and a second drain electrode 42 that are located in the source-drain layer. The second light-emitting element 38 includes a second anode 43 located in the anode layer, a second light-emitting layer 44 located in the light-emitting layer, and a second cathode 45 located in the cathode layer In this configuration, the signal transmission line is electrically insulated from the second pixel circuit 37, so that the second pixel circuit 37 cannot receive a driving signal. As a result, the compensation sub-pixel 11 cannot emit light, thereby preventing the compensation sub-pixel 11 from affecting the resolution of first display area 3. Further, by setting the second pixel circuit 37 and the first pixel circuit 28 to have same structures and setting the second light-emitting element 38 and the first light-emitting element 29 to have same structures, coupling capacitances caused by the data line 13 overlapping each film layer structure of the compensation sub-pixel 11 and the light-emitting sub-pixel 10 tend to be the same. Therefore, when the load on the first data line 14 is compensated by the compensation sub-pixel 11, the load on the first data line 14 is allowed to be the same as the load on the second data line 15.

Figure 8:
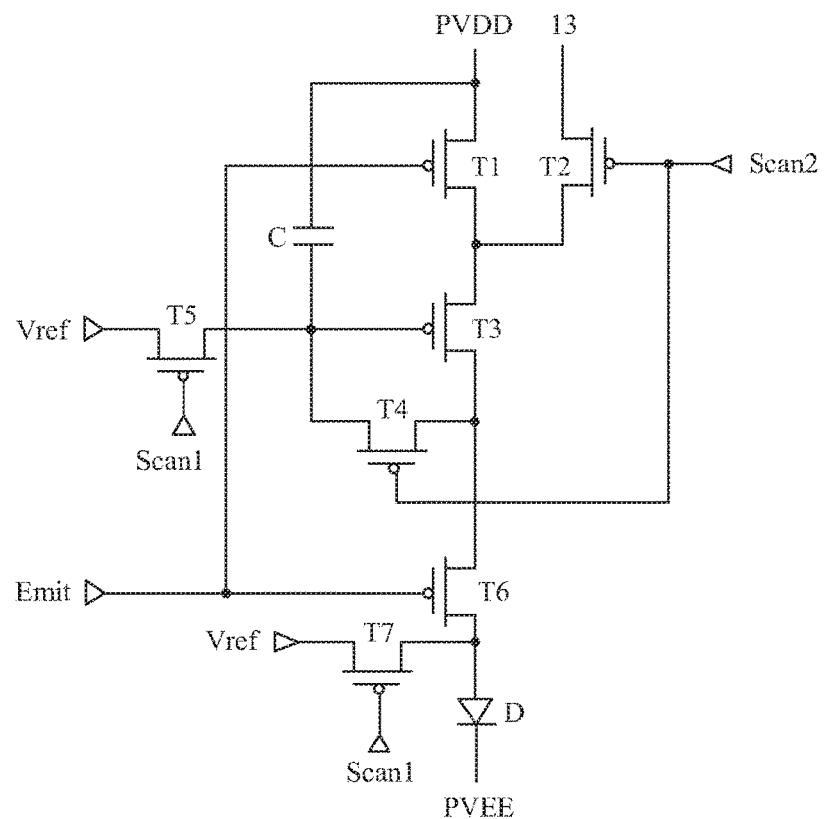
FIG. 8 is a schematic diagram illustrating a structure of a pixel circuit in the related art.

FIG. 8 is a schematic diagram illustrating a structure of a pixel circuit in the related art, and the first pixel circuit 28 and the second pixel circuit 37 may adopt the structure of the pixel circuit as shown in FIG. 8. The pixel circuit includes first to seventh transistors T1-T7. Each of the fifth transistor T5 and the seventh transistor T7 includes a gate electrode connected to a first gate scan line Scan1. Each of the second transistor T2 and the fourth transistor T4 includes a gate electrode connected to a second gate scan line Scan2. Each of the first transistor T1 and the sixth transistor T6 includes a gate electrode connected to a light-emitting control signal line Emit. The first transistor T1 includes a first electrode connected to a power signal line PVDD. The second transistor T2 includes a first electrode connected to a data line 13. Each of the fifth transistor T5 and the eleventh transistor includes a first electrode connected to a reference voltage line Vref.

One driving cycle of the pixel circuit includes an initialization period, a charging period, and a light-emitting control period.

During the initialization period, the first gate scan line Scan1 provides a low level, the second gate scan line Scan2 and the light-emitting control signal line Emit respectively provide a high level, the fifth transistor T5 and the seventh transistor T7 are turned on, and a reference voltage signal provided by the reference voltage line Vref is used to rest the gate electrode of the third transistor T3 and an anode of a light-emitting diode D.

During the charging period, the first gate scan line Scan1 and the light-emitting control signal line Emit respectively provide a high level, the second gate scan line Scan2 provides a low level, the second transistor T2, the third transistor T3 and the fourth transistor T4 are turned on, and the data line 13 writes a data signal to the third transistor T3.

During the light-emitting control period, the first gate scan line Scan1 and the second gate scan line Scan2 respectively provide a high level, the light-emitting control signal line Emit provides a low level, and the first transistor T1, the third transistor T3, and the sixth transistor T6 are turned on, so that the light-emitting element D is driven to emit light under control of the written data signal and a power signal supplied from the power signal line PVDD.

Based on this, the signal transmission lines described above may include the data line 13, and/or the light-emitting control signal line Emit, and/or the power signal line PVDD.

When the signal transmission lines include the data line 13, the data line 13 is electrically insulated from the second pixel circuit 37, so that the second pixel circuit 37 cannot receive a data voltage signal for driving the second light-emitting element 38 to emit light, and thus the second light-emitting element 38 cannot emit light. When the signal transmission lines include the light-emitting control signal line Emit, the light-emitting control signal line Emit is electrically insulated from the second pixel circuit 37, so that the second pixel circuit 37 cannot receive a light-emitting control signal for controlling the second light-emitting element 38 to emit light, and thus the second light-emitting element 38 cannot emit light. When the signal transmission lines include the power signal line PVDD, the power signal line PVDD is electrically insulated from the second pixel circuit 37, so that the second pixel circuit 37 cannot receive a power signal for driving the second light-emitting element 38 to emit light, and thus the second light-emitting element 38 cannot emit light.

Figure 9:
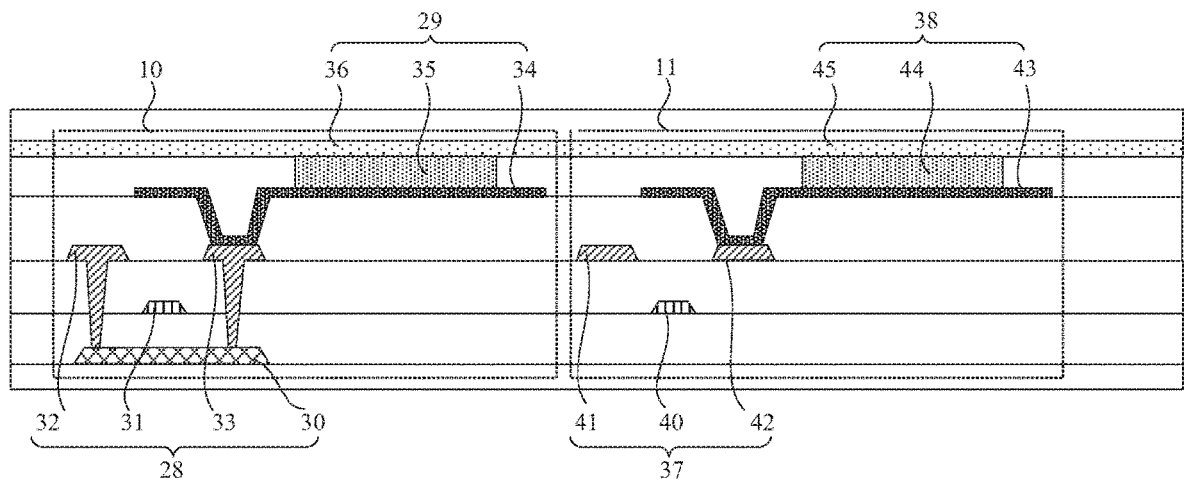
FIG. 9 is a schematic diagram illustrating another film layer structure of a compensation sub-pixel according to a representative embodiment of the present disclosure.

FIG. 9 is a schematic diagram illustrating another film layer structure of a compensation sub-pixel according to an embodiment of the present disclosure. In an embodiment, as shown in FIG. 9, the compensation sub-pixel 11 includes a second pixel circuit 37 and a second light-emitting element 38. The second pixel circuit 37 includes a second gate electrode 40 located in the gate layer, and a second source electrode 41 and a second drain electrode 42 that are located in the source-drain layer. The second light-emitting element 38 includes a second anode 43 located in the anode layer, a second light-emitting layer 44 located in the light-emitting layer, and a second cathode 45 located in the cathode layer.

In this configuration, none of the seven transistors included in the second pixel circuit 37 is provided with an active layer, or the transistor that affects light emission of the compensation sub-pixel is not provided with an active layer. For example, any one or more of the first transistor T1, the second transistor T2, and the third transistor T3, the fifth transistor T5, the sixth transistor T6, and the seventh transistor T7 is/are not provided with an active layer. The second pixel circuit 37 includes no active layer, so that transistors included in the second pixel circuit 37 cannot operate normally, thereby preventing the compensation sub-pixel 11 from emitting light and thus avoiding an influence of the compensation sub-pixel 11 on the resolution of the first display area 3. Based on this, by providing the second pixel circuit 37 with the second gate electrode 40, the second source electrode 41, and the second drain electrode 42 and setting the second light-emitting element 38 and the first light-emitting element 29 to have same structures, a difference in the coupling capacitances caused by the data line 13 overlapping the compensation sub-pixel 11 and the light-emitting sub-pixel 10 then can be weakened. Therefore, when the load on the first data line 14 is compensated by the compensation sub-pixel 11, a difference between the load on the first data line 14 and the load on the second data line 15 then can be effectively decreased.

Figure 10:
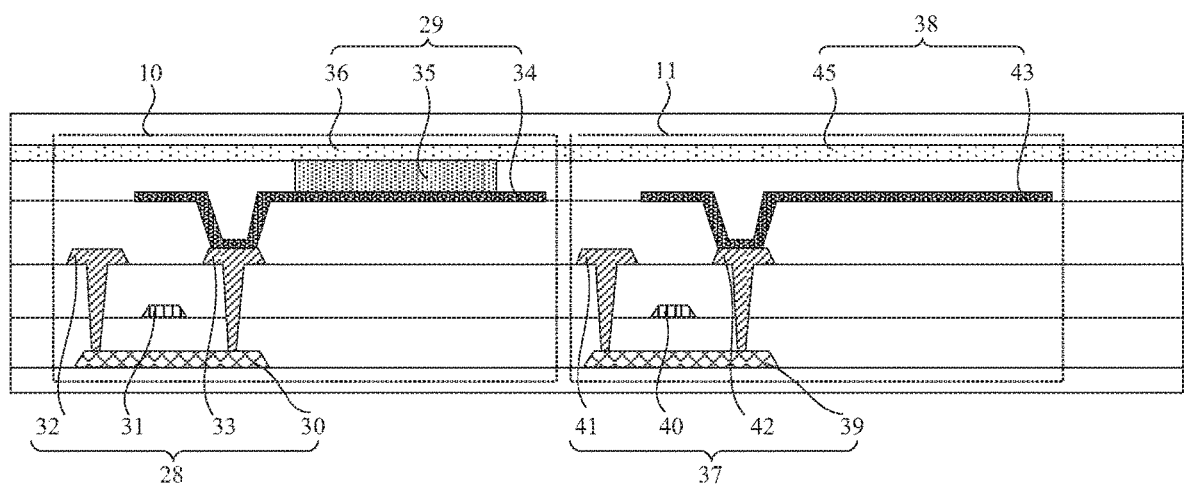
FIG. 10 is a schematic diagram illustrating still another film layer structure of a compensation sub-pixel according to a representative embodiment of the present disclosure.

FIG. 10 is a schematic diagram illustrating still another film layer structure of a compensation sub-pixel according to an embodiment of the present disclosure. In an embodiment, as shown in FIG. 10, the compensation sub-pixel 11 includes a second pixel circuit 37 and a second light-emitting element 38. The second pixel circuit 37 includes a second active layer 39 located in the active layer, a second gate electrode 40 located in the gate layer, and a second source electrode 41 and a second drain electrode 42 that are located in the source-drain layer. The second light-emitting element 38 includes a second anode 43 located in the anode layer and a second cathode 45 located in the cathode layer.

In this configuration, the second light-emitting element 38 is not provided with the light-emitting layer, so that the second light-emitting element 38 cannot emit light, and thus the compensation sub-pixel 11 cannot emit light. Moreover, the second light-emitting element 38 further includes a second cathode 45. Since the cathode layer is usually arranged as a whole layer, the second cathode 45 is remained so that a cathode signal transmitted in each area of the cathode layer can have a uniform voltage drop, thereby improving the display effect.

Figure 11:
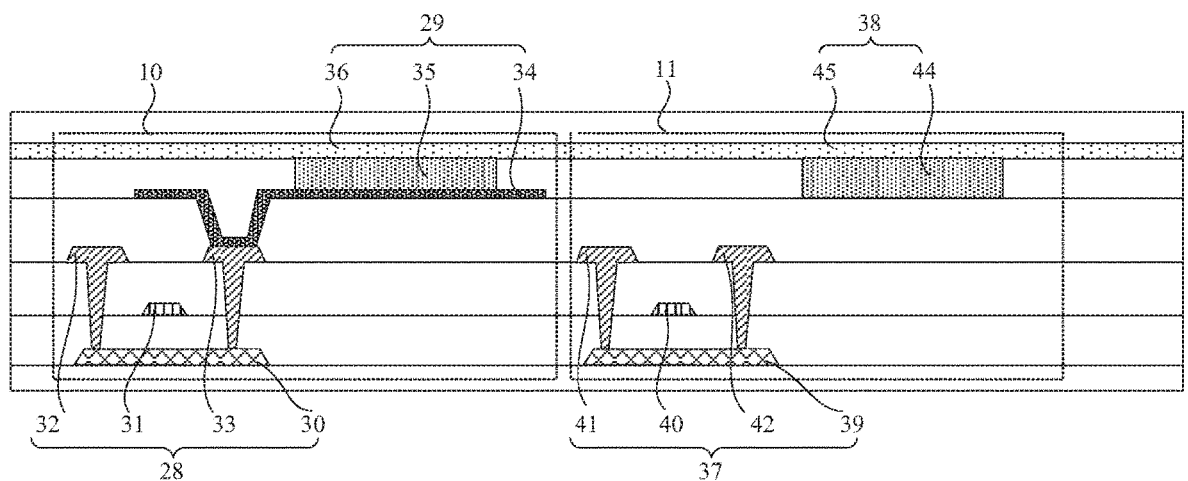
FIG. 11 is a schematic diagram illustrating yet another film layer structure of a compensation sub-pixel according to a representative embodiment of the present disclosure.
Figure 12:
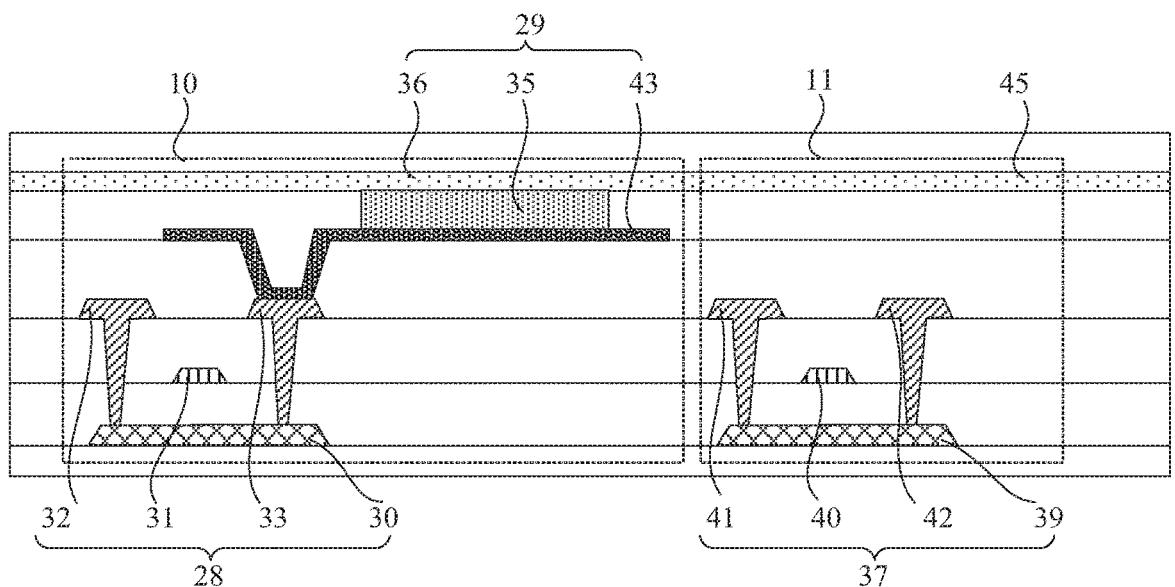
FIG. 12 is a schematic diagram illustrating yet another film layer structure of a compensation sub-pixel according to a representative embodiment of the present disclosure.

In an embodiment, with reference to FIG. 11 and FIG. 12, the compensation sub-pixel 11 includes a second pixel circuit 37 and a second light-emitting element 38. The second pixel circuit 37 includes a second active layer 39 located in the active layer, a second gate electrode 40 located in the gate layer, and a second source electrode 41 and a second drain electrode 42 that are located in the source-drain layer. As shown in FIG. 11, which is a schematic diagram illustrating yet another film layer structure of a compensation sub-pixel according to an embodiment of the present disclosure, the second light-emitting element 38 includes a second light-emitting layer 44 located in the light-emitting layer and a second cathode 45 located in the cathode layer (e.g., only a second light-emitting layer 44 located in the light-emitting layer and a second cathode 45 located in the cathode layer). In this configuration, the second light-emitting element 38 is not provided with an anode, so that the compensation sub-pixel 11 cannot emit light. Alternatively, as shown in FIG. 12, which is a schematic diagram illustrating yet another film layer structure of a compensation sub-pixel according to an embodiment of the present disclosure, the second light-emitting element 38 includes a second cathode 45 located in the cathode layer (e.g., only includes a second cathode 45 located in the cathode layer). In this configuration, the second light-emitting element 38 is not provided with an anode or light-emitting layer, so that the compensation sub-pixel 11 cannot emit light. Further, under a premise that the compensation sub-pixel 11 cannot emit light, by further setting the second pixel circuit 37 and the first pixel circuit 28 to have same structures, coupling capacitances caused by the data line 13 overlapping the second pixel circuit 37 and the first pixel circuit 28 then can be the same. Therefore, when the load on the first data line 14 is compensated by the compensation sub-pixel 11, a difference between the load on the first data line 14 and the load on the second data line 15 then can be effectively decreased.

In addition, it should be noted that a thickness of a planarization layer between the anode layer and a film layer where the data line 13 is located is a larger than that of other insulation layer, so a coupling capacitance formed between the anode layer and the data line 13 is smaller, and thus the coupling capacitance has a small influence on the load on the data line 13. Therefore, in this configuration, the compensation sub-pixel 11 does not emit light by removing the anode so as to remain other metal layer in the compensation sub-pixel 11, and thus a difference between the coupling capacitances caused by the data line 13 overlapping light-emitting elements in the compensation sub-pixel 11 and the light-emitting sub-pixel 10 then can be greatly decreased.

Figure 13:
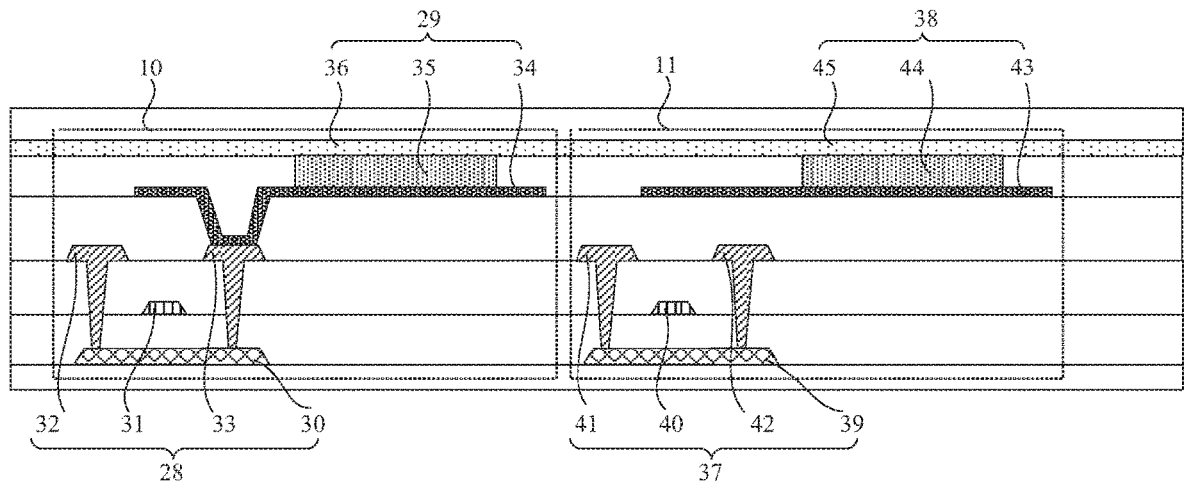
FIG. 13 is a schematic diagram illustrating yet another film layer structure of a compensation sub-pixel according to a representative embodiment of the present disclosure.

FIG. 13 is a schematic diagram illustrating yet another film layer structure of a compensation sub-pixel according to an embodiment of the present disclosure. In an embodiment, as shown in FIG. 13, the compensation sub-pixel 11 includes a second pixel circuit 37 and a second light-emitting element

38. The second pixel circuit 37 includes a second active layer 39 located in the active layer, a second gate electrode 40 located in the gate layer, and a second source electrode 41 and a second drain electrode 42 that are located in the source-drain layer. The second light-emitting element 38 includes a second anode 43 located in the anode layer, a second light-emitting layer 44 located in the light-emitting layer, and a second cathode 45 located in the cathode layer. The second anode 43 is floating.

In this configuration, by making the second anode 43 be floating, the second light-emitting element 38 cannot receive a driving current, so that the compensation sub-pixel 11 cannot emit light, thereby preventing the compensation sub-pixel 11 from affecting the resolution of the first display area 3. Moreover, by setting the second pixel circuit 37 and the first pixel circuit 28 to have same structures and setting the second light-emitting element 38 and the first light-emitting element 29 to have same structures, the coupling capacitances caused by the data line 13 overlapping light-emitting elements in the compensation sub-pixel 11 and the light-emitting sub-pixel 10 can be the same. Therefore, when the load on the first data line 14 is compensated by the compensation sub-pixel 11, a difference between the load on the first data line 14 and the load on the second data line 15 then can be effectively decreased.

Figure 14:
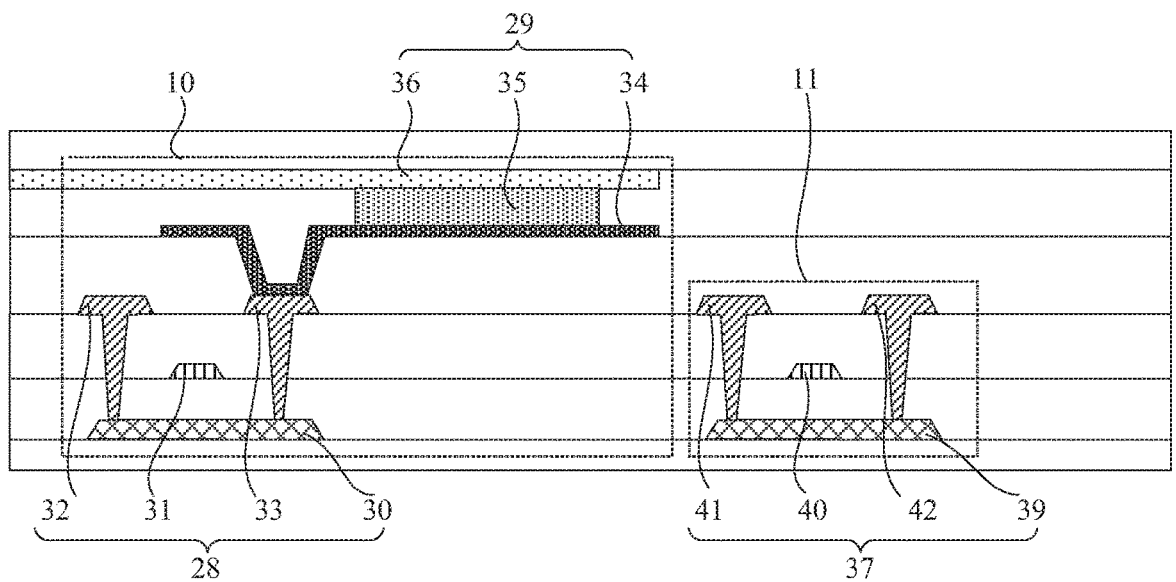
FIG. 14 is a schematic diagram illustrating yet another film layer structure of a compensation sub-pixel according to a representative embodiment of the present disclosure.

FIG. 14 is a schematic diagram illustrating yet another film layer structure of a compensation sub-pixel according to an embodiment of the present disclosure. In an embodiment, as shown in FIG. 14, the compensation sub-pixel 11 includes the second pixel circuit 37 (e.g., only the second pixel circuit 37), and the second pixel circuit 37 includes a second active layer 39 located in the active layer, a second gate electrode 40 located in the gate layer, and a second source electrode 41 and a second drain electrode 42 that are located in the source-drain layer.

In this configuration, the compensation sub-pixel 11 is not provided with a light-emitting element, so that the compensation sub-pixel 11 cannot emit light, thereby preventing the compensation sub-pixel 11 from affecting the resolution of the first display area 3. Moreover, by further setting the second pixel circuit 37 and the first pixel circuit 28 to have same structures, the coupling capacitances formed by the data line 13 overlapping the second pixel circuit 37 and the first pixel circuit 28 then can be the same, and a difference between the coupling capacitances caused by the data line 13 overlapping the compensation sub-pixel 11 and the light-emitting sub-pixel 10 then can be greatly decreased.

Figure 15:
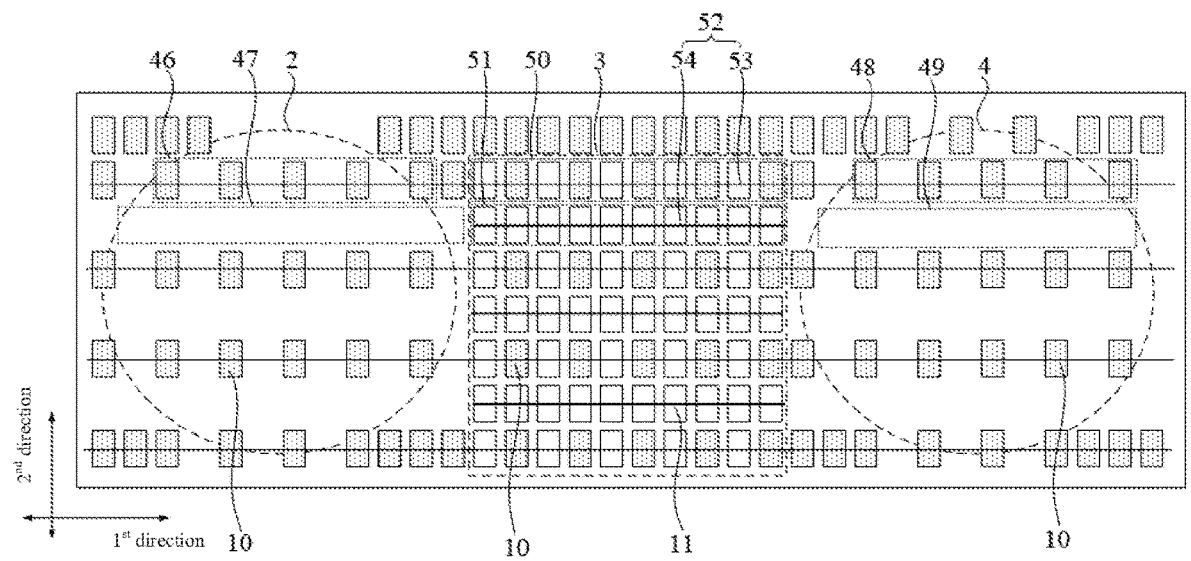
FIG. 15 is a schematic diagram illustrating still another arrangement of sub-pixels in a first semi-transmissive area, a first display area, and a second semi-transmissive area according to a representative embodiment of the present disclosure.

FIG. 15 is a schematic diagram illustrating still another arrangement of sub-pixels in a first semi-transmissive area, a first display area, and a second semi-transmissive area according to an embodiment of the present disclosure. As shown in FIG. 15, the first semi-transmissive area 2 is provided with first pixel rows 46 and first blank rows 47 alternately arranged in the second direction. The first blank row 47 is provided with no sub-pixel 9. The second semi-transmissive area 4 is provided with second pixel rows 48 and second blank rows 49 alternately arranged in the second direction. The second blank row 49 is provided with no sub-pixel 9. An arrangement of light-emitting sub-pixels 10 in the first display area 3 is the same as an arrangement of light-emitting sub-pixels 10 in the first semi-transmissive area 2 and in the second semi-transmissive area 4. The first display area 3 is provided with third pixel rows 50 and fourth pixel rows 51 alternately arranged in the second direction. The third pixel row 50 includes light-emitting sub-pixels 10 and compensation sub-pixels 11 arranged in the first direction, and the fourth pixel row 51 includes compensation sub-pixels 11 (e.g., only compensation sub-pixels 11).

In the configuration described above, the second pixel rows 48 and the second blank rows 49 in the first semi-transmissive area 2 are alternately arranged, and the second pixel rows 48 and the second blank rows 49 in the second semi-transmissive area 4 are alternately arranged, so that the light-emitting sub-pixels 10 are more evenly distributed in the first semi-transmissive area 2 and in the second semi-transmissive area 4. In this way, brightness uniformity in each area of the first semi-transmissive area 2 and the second semi-transmissive area 4 is improved. Moreover, since the first blank row 47 and the second blank row 49 are provided with no sub-pixel 9, a transmissive area in the first semi-transmissive area 2 and in the second semi-transmissive area 4 can be aggregated, and transmittance of the first semi-transmissive area 2 and in the second semi-transmissive area 4 can be effectively improved, thereby optimizing the image quality.

In an embodiment, with further reference to FIG. 15, along the first direction, the first pixel row 46, the second pixel row 48, and the third pixel row 50 are arranged in a same row, and the first blank row 47, the second blank row 49, and the fourth pixel row 51 are arranged in a same row. The panel further includes a plurality of gate lines 52 including first gate lines 53 and second gate lines 54. The first gate line 53 passes through the first pixel row 46, the second pixel row 48, and the third pixel row 50, and the second gate line 54 passes through the fourth pixel row 51. The second gate line 54, the first blank row 47 and the second blank row 49 do not overlap in a direction perpendicular to a plane of the display panel.

For the second display area 5, in order to drive the light-emitting sub-pixels 10 in the second display area 5 to emit light normally, each pixel row in the second display area 5 is passed through by the gate line 52. That is, a coupling capacitance formed between the second data line 15 and the gate line 52 affects the load on the second data line 15. Based on the configuration described above, when the second gate line 54 passes through the fourth pixel row 51 in the first display area 3 and the first data line 14 passes through the first display area 3, a coupling capacitance is also formed between the first data line 14 and the second gate line 54, thereby further reducing a difference between the load on the first data line 14 and the load on the second data line 15. Moreover, the second gate line 54, the first blank row 47 and the second blank row 49 do not overlap, so that the second gate line 54 can be prevented from blocking the first blank row 47 and the second blank row 49, thereby avoiding an influence on transmittance of the first semi-transmissive area 2 and the second semi-transmissive area 4.

In an embodiment, with further reference to FIG. 15, the second gate line 54 passes through only the fourth pixel row 51, and two ends of the second gate line 54 are floating. Since the fourth pixel row 51 only includes compensation sub-pixels 11 and the compensation sub-pixels 11 do not need to perform image display, the two ends of the second gate line 54 are floating so that no signal is transmitted in the second gate line 54 and normal light-emitting of the display panel will not be influenced.

Figure 16:
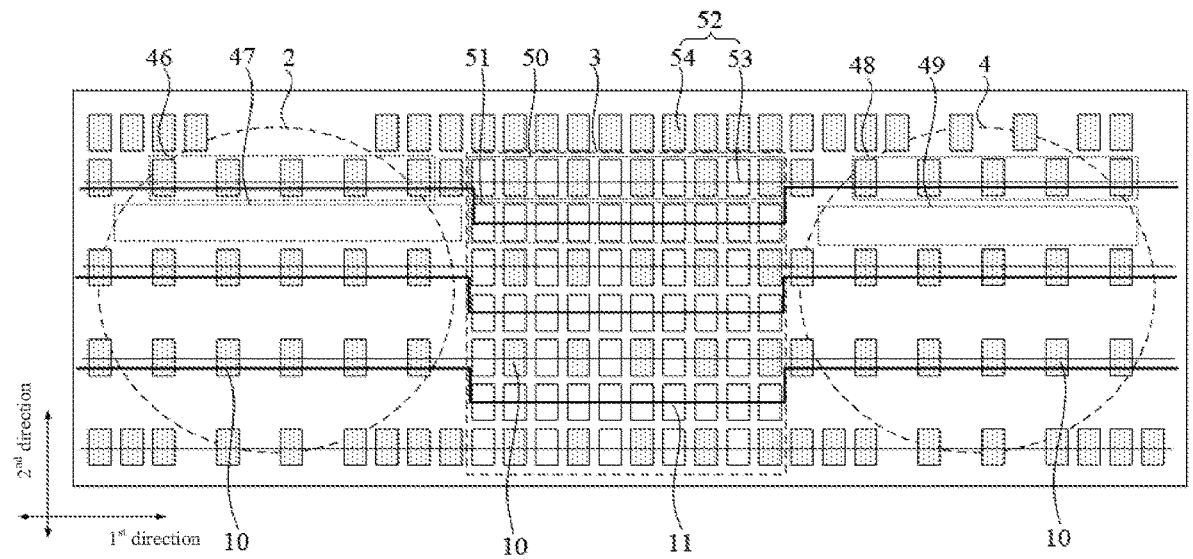
FIG. 16 is another schematic diagram of a structure of a second gate line according to a representative embodiment of the present disclosure.

As shown in FIG. 16, which is another schematic diagram of a structure of a second gate line according to an embodiment of the present disclosure, the second gate line 54 detours in the first pixel row 46 and in the second pixel row 48. In this case, the two ends of the second gate line 54 are not floating, and a scan signal is transmitted in the second gate line 54.

It should be noted that when the two ends of the second gate line 54 are floating, in combination with FIG. 8, a first scan signal and a second scan signal are not reused, and each pixel row corresponds to at least two gate scan lines S1, S2, and one light-emitting control signal line Emit. Each stage of shift register needs to independently output signals in at least the three signal lines described above. When the second gate line 54 detours in the first pixel row 46 and in the second pixel row 48, in combination with FIG. 8, the first scan signal and the second scan signal are reused, so that when the second scan signal of a previous stage is outputted, it can be reused as the first scan signal of a next stage. In this way, the number of scan lines can be reduced by half for each stage of shift register, so that scan lines can be reduced and the traces can be saved.

Figure 17:
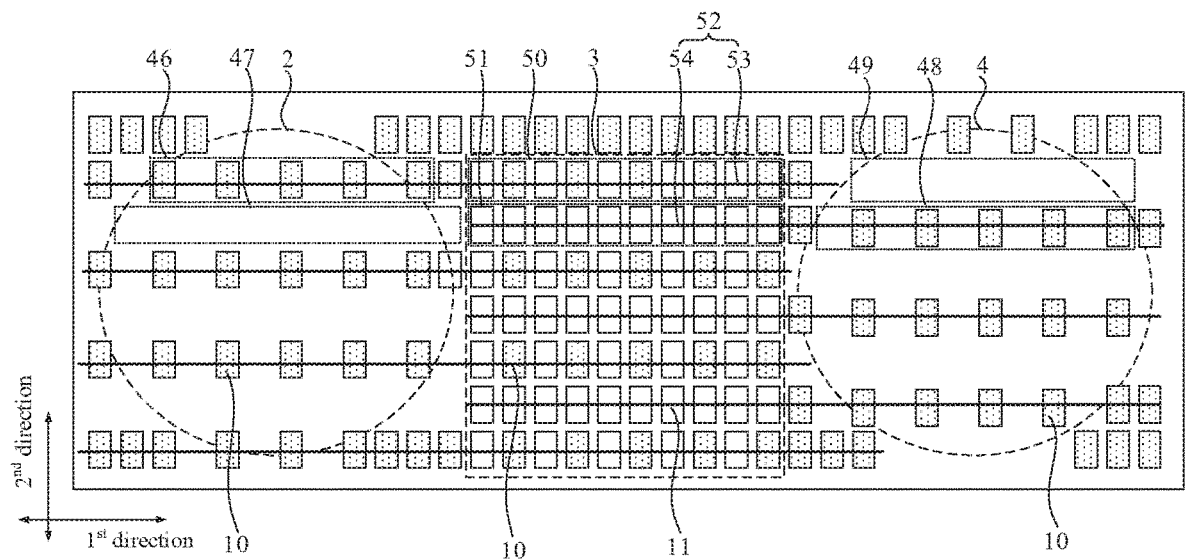
FIG. 17 is a schematic diagram illustrating yet another arrangement of sub-pixels in a first semi-transmissive area, a first display area, and a second semi-transmissive area according to a representative embodiment of the present disclosure.

FIG. 17 is a schematic diagram illustrating yet another arrangement of sub-pixels in a first semi-transmissive area, a first display area, and a second semi-transmissive area according to an embodiment of the present disclosure. In an embodiment, as shown in FIG. 17, along the first direction, the first pixel row 46, the third pixel row 50, and the second blank row 49 are arranged in a same row, and the first blank row 47, the fourth pixel row 51, and the second pixel row 48 are arranged in a same row. The display panel further includes a plurality of gate lines 52 extending in the first direction, and the plurality of gate lines 52 include first gate lines 53 and second gate lines 54. The first gate line 53 passes through the first pixel row 46 and the third pixel row 50, and the second gate line 54 passes through the second pixel row 48 and the fourth pixel row 51. In the direction perpendicular to the plane of the display panel, the first gate line 53 does not overlap the second blank row 49, and the second gate line 54 does not overlap the first blank row 47.

Based on the configuration described above, by making the first gate line 53 not overlap the second blank row 49 and making the second gate line 54 not overlap the first blank row 47, the first gate line 53 can be prevented from blocking the first blank row 47, and the second gate line 54 can be prevented from blocking the second blank row 49, thereby avoiding an influence on transmittance of the first semi-transmissive area 2 and the second semi-transmissive area 4. Moreover, there are gate lines 52 passing through the third pixel row 50 and the fourth pixel row 51, so that a coupling capacitance is formed between the first data line 14 and the gate line 52, thereby further reducing a difference between the load on the first data line 14 and the load on the second data line 15.

Further, an end of the first gate line 53 close to the second semi-transmissive area 4 is floating, and an end of the second gate line 54 close to the first semi-transmissive area 2 is floating. In this case, the display panel includes two shift registers, the other end of the first gate line 53 is electrically connected to one shift register, and the other end of the second gate line 54 is electrically connected to the other shift register.

Figure 18:
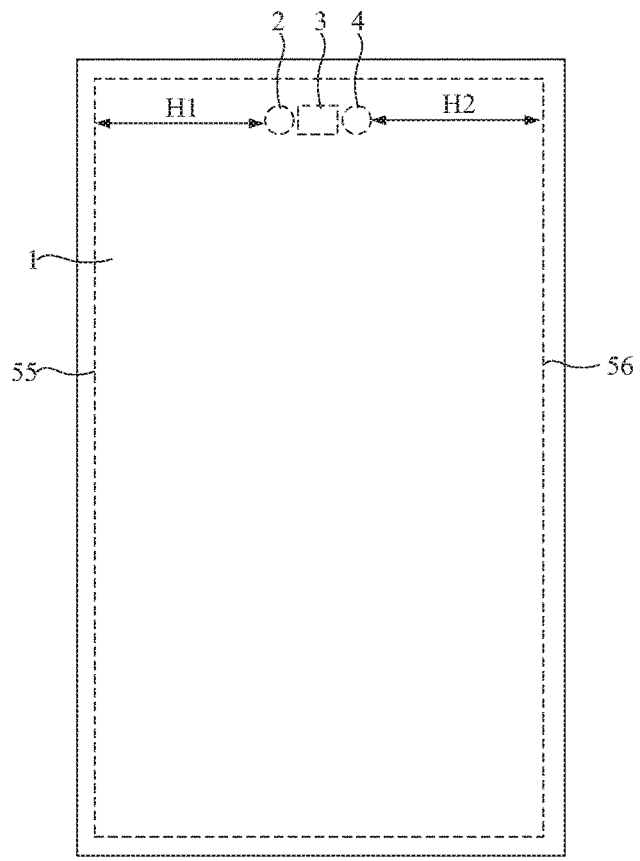
FIG. 18 is a schematic diagram of another structure of a display panel according to a representative embodiment of the present disclosure.

FIG. 18 is a schematic diagram of another structure of a display panel according to an embodiment of the present disclosure. In an embodiment, as shown in FIG. 18, the display area 1 includes a first edge 55 and a second edge 56 each extending in the second direction. The first semi-transmissive area 2 and the second semi-transmissive area 4 have same areas and same shapes. A minimum distance H1 between the first semi-transmissive area 2 and the first edge 55 is equal to a minimum distance H2 between the second semi-transmissive area 4 and the second edge 56.

It should be noted that the minimum distance between the first semi-transmissive area 2 and the first edge 55 refers to a minimum distance between an edge of the first semi-transmissive area 2 and the first edge 55, and the minimum distance between the second semi-transmissive area 4 and the edge 55 refers to a minimum distance between an edge of the second semi-transmissive area 4 and the second edge 56.

With reference to FIG. 17, the minimum distance H1 between the first semi-transmissive area 2 and the first edge 55 is equal to the minimum distance H2 between the second semi-transmissive area 4 and the second edge 56, and the first gate line 53 and the second gate line 54 have same lengths, so that the load on the first gate line 53 and the load on the second gate line 54 tend to be the same, thereby achieving uniformity in the voltage drop when the scan signal is transmitted in the first gate line 53 and in the second gate line 54.

Figure 19:
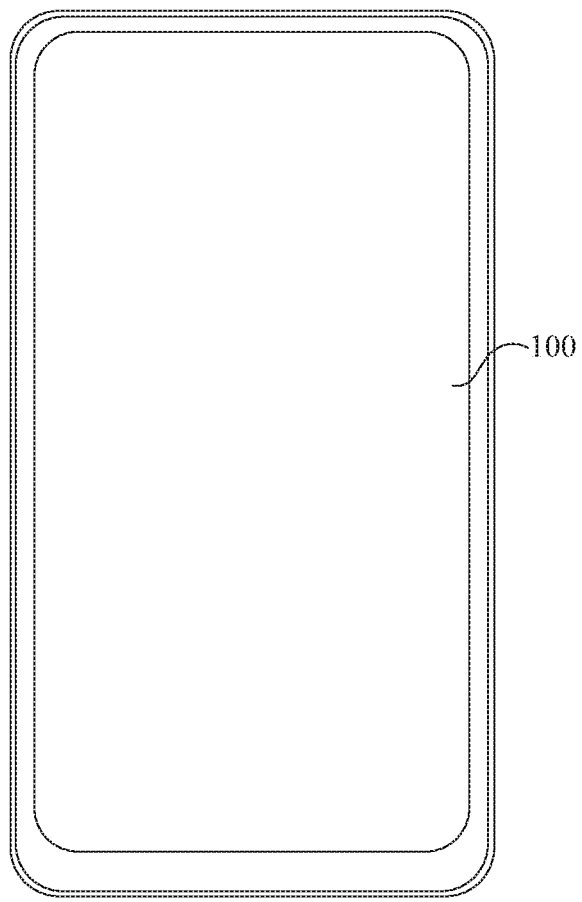
FIG. 19 is a schematic diagram of a structure of a display device according to a representative embodiment of the present disclosure.

An embodiment of the present disclosure further provides a display device. As shown in FIG. 19, which is a schematic diagram of a structure of a display device according to an embodiment of the present disclosure, the display device includes the display panel 100 described above. A structure of the display panel 100 has been described in detail in the above embodiments and will not be further described herein. It should be noted that the display device shown in FIG. 19 is merely illustrative, and the display device can be any electronic device having a display function such as a cell-phone, a tablet computer, a notebook computer, an electronic paper book, or a television.

The display device provided by this embodiment of the present disclosure includes the display panel 100 described above. Therefore, with the display device, the first display area 3, the first semi-transmissive area 2 and the second semi-transmissive area 4 can have a same resolution. This can further achieve that the load on the first data line 14 and the load on the second data line 15 tend to be uniform and thus improve the display uniformity of the display device, while effectively improving the display quality.

The above-described embodiments are representative embodiments of the present disclosure and are not intended to limit the present disclosure. Any modifications, equivalent substitutions and improvements made within the principle of the present disclosure shall fall into the protection scope of the present disclosure.

Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, having a display area comprising a first semi-transmissive area, a second semi-transmissive area, a first display area, and a second display area, wherein the first semi-transmissive area, the first display area, and the second semi-transmissive area are sequentially arranged in a first direction, and the second display area is located at a side of at least one of the first semi-transmissive area or the second semi-transmissive area facing away from the first display area, the display panel comprising:

a substrate;

a pixel circuit layer and a light-emitting element layer located on the substrate;
a plurality of sub-pixels comprising light-emitting sub-pixels and compensation sub-pixels, the light-emitting sub-pixels being configured to emit light and configured to display images, and the compensation sub-pixels being not capable of emitting light and not configured to display images; and
data lines each extending in a second direction, the data lines comprising first data lines and second data lines,
wherein the compensation sub-pixels are only located in the first display area; a density of the plurality of sub-pixels in the first semi-transmissive area and a density of the plurality of sub-pixels in the second semi-transmissive area are smaller than a density of the plurality of sub-pixels in the second display area; and the first display area, the first semi-transmissive area, and the second semi-transmissive area have a same density of light-emitting sub-pixels;
a plurality of first pixel columns is provided in the first display area, and a plurality of second pixel columns is provided in the second display area; each of the first data lines passes through a respective first pixel column of the plurality of first pixel columns, and each of the second data lines passes through a respective second pixel column of the plurality of second pixel columns; each of the plurality of first pixel columns comprises n1 sub-pixels arranged in the second direction, and each of the plurality of second pixel columns comprises n2 sub-pixels arranged in the second direction, where $n1=K*n2$ and $0.99 \le K \le 1.01$; and the second direction intersects the first direction.

2. The display panel according to claim 1,
wherein each of the first semi-transmissive area and the second semi-transmissive area is provided with third pixel columns and fourth pixel columns alternately arranged in the first direction, and the light-emitting sub-pixels in each of the third pixel columns and in each of the fourth pixel columns are arranged in the first direction in a misalignment manner;
wherein an arrangement of the light-emitting sub-pixels in the first display area is identical to an arrangement of the light-emitting sub-pixels in the first semi-transmissive area and in the second semi-transmissive area, and each of the first pixel columns in the first display area comprises a same number of compensation sub-pixels.

3. The display panel according to claim 1,
wherein each of the first semi-transmissive area and the second semi-transmissive area is provided with fifth pixel columns and blank columns alternately arranged along the first direction, and each of the blank columns comprises no sub-pixel; and
an arrangement of light-emitting sub-pixels in the first display area is identical to an arrangement of light-emitting sub-pixels in the first semi-transmissive area and in the second semi-transmissive area, the plurality of first pixel columns comprises first sub-pixel columns and second sub-pixel columns alternately arranged in the first direction, and the first sub-pixel columns comprise light-emitting sub-pixels and compensation sub-pixels while the second sub-pixel columns comprise only compensation sub-pixels.

4. The display panel according to claim 1,
wherein the pixel circuit layer comprises an active layer, a gate layer, and a source-drain layer, and the light-emitting element layer comprises an anode layer, a light-emitting layer, and a cathode layer;
each of the light-emitting sub-pixels comprises a first pixel circuit and a first light-emitting element, wherein the first pixel circuit comprises a first active layer located in the active layer, a first gate electrode located in the gate layer, and a first source electrode and a first drain electrode that are located in the source-drain layer; and
the first light-emitting element comprises a first anode located in the anode layer, a first light-emitting layer located in the light-emitting layer, and a first cathode located in the cathode layer.

5. The display panel according to claim 4, further comprising a plurality of signal transmission lines electrically connected to the first pixel circuit,
wherein each of the compensation sub-pixels comprises a second pixel circuit electrically insulated from the plurality of signal transmission lines, and a second light-emitting element;
the second pixel circuit comprises a second active layer located in the active layer, a second gate electrode located in the gate layer, and a second source electrode and a second drain electrode that are located in the source-drain layer; and
the second light-emitting element comprises a second anode located in the anode layer, a second light-emitting layer located in the light-emitting layer, and a second cathode located in the cathode layer.

6. The display panel according to claim 5, wherein the plurality of signal transmission lines comprises at least one of the data lines, the light-emitting control signal lines, or the power signal lines.

7. The display panel according to claim 4, wherein each of the compensation sub-pixels comprises a second pixel circuit and a second light-emitting element,
the second pixel circuit comprises a second gate electrode located in the gate layer, and a second source electrode and a second drain electrode that are located in the source-drain layer; and
the second light-emitting element comprises a second anode located in the anode layer, a second light-emitting layer located in the light-emitting layer, and a second cathode located in the cathode layer.

8. The display panel according to claim 4, wherein each of the compensation sub-pixels comprises a second pixel circuit and a second light-emitting element;
the second pixel circuit comprises a second active layer located in the active layer, a second gate electrode located in the gate layer, and a second source electrode and a second drain electrode that are located in the source-drain layer; and
the second light-emitting element comprises a second anode located in the anode layer and a second cathode located in the cathode layer.

9. The display panel according to claim 4, wherein each of the compensation sub-pixels comprises a second pixel circuit and a second light-emitting element;
the second pixel circuit comprises a second active layer located in the active layer, a second gate electrode located in the gate layer, and a second source electrode and a second drain electrode that are located in the source-drain layer; and
the second light-emitting element comprises a second light-emitting layer located in the light-emitting layer and a second cathode located in the cathode layer, or the second light-emitting element comprises a second cathode located in the cathode layer.

10. The display panel according to claim 4, wherein each of the compensation sub-pixels comprises a second pixel circuit and a second light-emitting element;

the second pixel circuit comprises a second active layer located in the active layer, a second gate electrode located in the gate layer, and a second source electrode and a second drain electrode that are located in the source-drain layer; and the second light-emitting element comprises a second anode located in the anode layer, a second light-emitting layer located in the light-emitting layer, and a second cathode located in the cathode layer, wherein the second anode is floating.

11. The display panel according to claim 4, wherein each of the compensation sub-pixels comprises only a second pixel circuit, and the second pixel circuit comprises a second active layer located in the active layer, a second gate electrode located in the gate layer, and a second source electrode and a second drain electrode that are located in the source-drain layer.

12. The display panel according to claim 1, wherein the first semi-transmissive area is provided with first pixel rows and first blank rows alternately arranged in the second direction, and each of the first blank rows is provided with no sub-pixels;

the second semi-transmissive area is provided with second pixel rows and second blank rows alternately arranged in the second direction, and each of the second blank rows is provided with no sub-pixels;

an arrangement of light-emitting sub-pixels in the first display area is identical to an arrangement of light-emitting sub-pixels in the first semi-transmissive area and in the second semi-transmissive area; and the first display area is provided with third pixel rows and fourth pixel rows alternately arranged in the second direction, each of the third pixel rows comprises light-emitting sub-pixels and compensation sub-pixels arranged in the first direction, and each of the fourth pixel rows comprises only compensation sub-pixels.

13. The display panel according to claim 12, wherein along the first direction, the first pixel row, the second pixel row, and the third pixel row are arranged in a same row, and the first blank row, the second blank row, and the fourth pixel row are arranged in a same row; and the display panel further comprises a plurality of gate lines comprising a first gate line and a second gate line, wherein the first gate line passes through the first pixel row, the second pixel row, and the third pixel row, and the second gate line passes through the fourth pixel row; and the second gate line, the first blank row and the second blank row do not overlap in a direction perpendicular to a plane of the display panel.

14. The display panel according to claim 13, wherein the second gate line passes through only the fourth pixel row, and two ends of the second gate line are floating.

15. The display panel according to claim 12, wherein along the first direction, the first pixel row, the third pixel row, and the second blank row are arranged in a same row, and the first blank row, the fourth pixel row, and the second pixel row are arranged in a same row; and the display panel further comprises a plurality of gate lines extending in the first direction, and the plurality of gate lines comprises a first gate line and a second gate line, wherein the first gate line passes through the first pixel row and the third pixel row, and the second gate line passes through the second pixel row and the fourth pixel row; and the first gate line does not overlap the second blank row and the second gate line does not overlap the first blank row in a direction perpendicular to a plane of the display panel.

16. The display panel according to claim 15, wherein an end of the first gate line close to the second semi-transmissive area is floating, and an end of the second gate line close to the first semi-transmissive area is floating.

17. The display panel according to claim 13, wherein the display area comprises a first edge and a second edge each extending in the second direction; and the first semi-transmissive area and the second semi-transmissive area have same areas and same shapes, and a minimum distance between the first semi-transmissive area and the first edge is equal to a minimum distance between the second semi-transmissive area and the second edge.

18. The display panel according to claim 15, wherein the display area comprises a first edge and a second edge each extending in the second direction; and the first semi-transmissive area and the second semi-transmissive area have same areas and same shapes, and a minimum distance between the first semi-transmissive area and the first edge is equal to a minimum distance between the second semi-transmissive area and the second edge.

19. A display device, comprising:

a display panel having a display area comprising a first semi-transmissive area, a second semi-transmissive area, a first display area, and a second display area, wherein the first semi-transmissive area, the first display area, and the second semi-transmissive area are sequentially arranged in a first direction, and the second display area is located at a side of at least one of the first semi-transmissive area or the second semi-transmissive area facing away from the first display area, wherein the display panel comprises:

a substrate;

a pixel circuit layer and a light-emitting element layer located on the substrate;

a plurality of sub-pixels comprising light-emitting sub-pixels and compensation sub-pixels, the light-emitting sub-pixels being configured to emit light and configured to display images, and the compensation sub-pixels being not capable of emitting light and not configured to display images; and data lines each extending in a second direction, the data lines comprising first data lines and second data lines, wherein the compensation sub-pixels are only located in the first display area; a density of the plurality of sub-pixels in the first semi-transmissive area and a density of the plurality of sub-pixels in the second semi-transmissive area are smaller than a density of the plurality of sub-pixels in the second display area; and the first display area, the first semi-transmissive area, and the second semi-transmissive area have a same density of light-emitting sub-pixels, wherein a plurality of first pixel columns is provided in the first display area, and a plurality of second pixel columns is provided in the second display area; each of the first data lines passes through a respective first pixel column of the plurality of first pixel columns, and each of the second data lines passes through a respective second pixel column of the plurality of second pixel columns; each of the plurality of first pixel columns comprises n1 sub-pixels arranged in the second direction, and each of the plurality of second pixel columns comprises n2 sub-pixels arranged in the second direction, where $n1=K*n2$ and $0.99 \leq K \leq 1.01$; and the second direction intersects the first direction.

* * * * *